United States Patent [19]

Schmidt et al.

[11] Patent Number: 4,843,036
[45] Date of Patent: Jun. 27, 1989

[54] METHOD FOR ENCAPSULATING ELECTRONIC DEVICES

[75] Inventors: John D. Schmidt; Martin A. Maurinus, both of Rochester, N.Y.

[73] Assignee: Eastman Kodak Company, Rochester, N.Y.

[21] Appl. No.: 67,743

[22] Filed: Jun. 29, 1987

[51] Int. Cl.⁴ .............................................. H01L 1/10
[52] U.S. Cl. ...................................... 437/224; 437/2; 437/906; 357/19; 357/72; 29/841; 264/272.11
[58] Field of Search ................... 437/219, 224, 211; 357/72, 19; 29/739

[56] References Cited

U.S. PATENT DOCUMENTS

| | | | |
|---|---|---|---|
| 3,178,621 | 4/1965 | Glickman | 317/234 |
| 3,381,071 | 4/1965 | Logan et al. | 264/135 |
| 4,027,383 | 6/1977 | Herndon et al. | 29/577 |
| 4,054,938 | 10/1977 | Morris | 361/401 |
| 4,136,351 | 1/1979 | Sugawara et al. | 357/19 |
| 4,143,456 | 3/1979 | Inoue | 437/219 |
| 4,203,792 | 5/1980 | Thompson | 156/272 |
| 4,215,359 | 7/1980 | Schermer et al. | 357/70 |
| 4,246,437 | 1/1981 | Frey et al. | 174/52 |
| 4,280,132 | 7/1981 | Hayakawa et al. | 357/70 |
| 4,326,239 | 4/1982 | Ohsawa et al. | 361/410 |
| 4,372,037 | 2/1983 | Scapple et al. | 29/613 |
| 4,410,874 | 10/1983 | Scapple et al. | 338/307 |
| 4,508,758 | 4/1985 | Wong | 427/96 |
| 4,533,975 | 8/1985 | Bill | 361/323 |
| 4,590,667 | 5/1986 | Simon | 437/219 |
| 4,635,356 | 1/1987 | Ohuchi et al. | 29/841 |

Primary Examiner—Olik Chaudhuri
Assistant Examiner—Beverly A. Pawlikowski
Attorney, Agent, or Firm—Jeffrey L. Brandt

[57] ABSTRACT

A method of encapsulating an electronic device on a substrate comprises depositing a radiatively curable barrier wall to contain a subsequently deposited encapsulant. Alternatively, an encapsulant comprising a majority of radiatively curable material is used in the absence of a barrier wall.

16 Claims, 2 Drawing Sheets

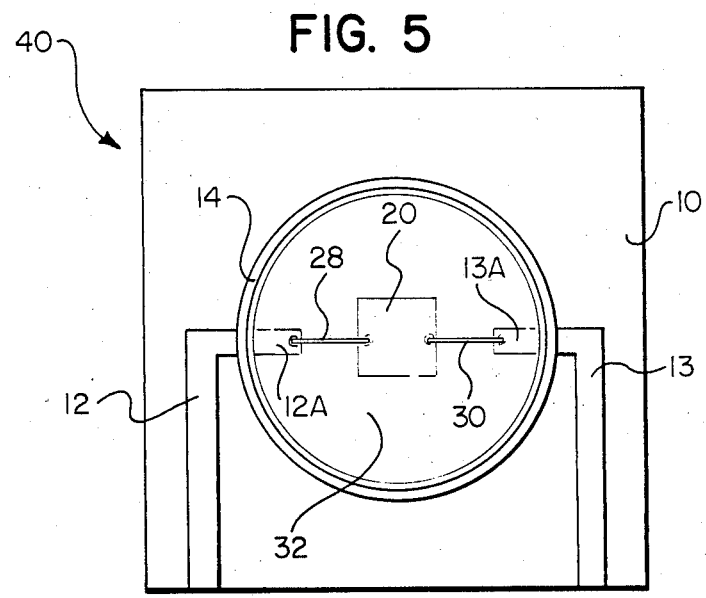
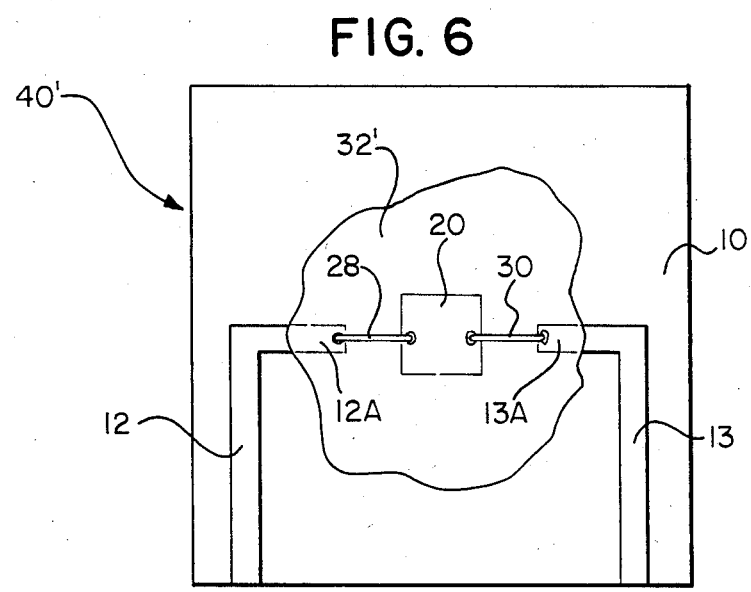

METHOD FOR ENCAPSULATING ELECTRONIC DEVICES

The present invention relates generally to encapsulating electronic devices, and more particularly to encapsulating electronic devices with radiatively curable materials.

BACKGROUND OF THE INVENTION

Current methods of encapsulating electronic devices exhibit one or more disadvantages, including; (1) the inability to predictably define the outer perimeter of the encapsulant, (2) the use of a time-consuming thermal hardening process, or (3) the inability to meet the dimensional packaging requirements of todays small, densely packed hybrid circuits.

U.S. Pat. No. 3,381,071 to C. W. Logan et al shows an electronic circuit encapsulated in a thermally cured encapsulant such as an epoxy resin. The encapsulant is formed by first screen-printing a barrier wall comprising a thermally curable material such as glass onto a ceramic substrate. The barrier wall is thermally cured, and the electronic device is mounted on the substrate within the barrier. The epoxy resin is deposited, in liquid form, over the electronic device and is contained within the barrier wall. The encapsulant is then cured through a second application of heat.

The process shown in C. W. Logan et al suffers from several disadvantages, the first being that the heat curing of the barrier wall necessarily results in some spreading of the wall, decreasing the compactness of the resulting encapsulated device. The second disadvantage is that the thermal curing of the encapsulant is very time consuming, taking, as described in the patent, 24 hours.

U.S. Pat. No. 4,203,792 to Thompson shows a method for encapsulating electronic devices using a multicomponent polymer material comprising a mixture of a minor amount of a radiation curable material with a major amount of a thermally curable material. After depositing the encapsulant over the electronic device, the encapsulant is radiatively cured for a short period of time to establish its shape. The encapsulant is subsequently heat cured to form the finished device. The process shown in Thompson suffers from the disadvantage of requiring a complex curing process including both a radiation curing stage and a heat curing stage.

U.S. Pat. No. 4,635,356 to Ohuchi et al shows a method of encapsulating an electronic device wherein a large, preformed spacer is used as a barrier wall to surround electronic components mounted on a radiation-transparent support board. The area within the barrier wall is filled with an encapsulant comprising a radiatively curable material. The encapsulant is cured by exposure to radiation through the support board, and the barrier is removed to form the finished device. Ohuchi et al suffers from the disadvantage that the preformed barrier wall is time consuming to place and remove, and requires a substantial amount of space.

It would thus be desirable to provide an encapsulated electronic device, and a method of forming the same, wherein the outer perimeter of the encapsulant and hence the shape of the encapsulant could be closely controlled. It would be further desirable if the process of forming such a device could be performed relatively faster than the thermal curing processes described in the background above.

OBJECTS OF THE INVENTION

The principal object of the present invention is to provide a new and improved method of encapsulating an electronic device wherein the size and shape of the encapsulant is closely controllable using a relatively fast curing process.

Another object of the present invention is to provide a method of encapsulating an electronic device wherein the encapsulant can be relatively quickly cured in relation to a thermal curing process.

A further object of the present invention is to provide a method of encapsulating an electronic device wherein the spread of the encapsulant can be closely controlled so as to permit dense packing on hybrid circuits.

Another object of the present invention is to provide an improved encapsulated electronic device.

SUMMARY OF THE INVENTION

In accordance with a first embodiment of the present invention, a new and improved method of encapsulating an electronic device on a substrate is provided wherein a barrier comprising a radiatively curable material is deposited about a predetermined location on the substrate. Suitable radiation is used to cure the barrier, and the electronic device is placed within the barrier. An encapsulant is then deposited over the electronic device within the barrier.

In a preferred embodiment of the invention, the barrier is deposited using a thick-film deposition technique. The barrier and encapsulant preferably comprise ultraviolet (UV) curable materials. The encapsulant can comprise an optically clear material when the electronic device comprises a photoelectric device.

BRIEF DESCRIPTION OF THE DRAWINGS

While the specification concludes with claims defining the features of the invention that are regarded as novel, it is believed that the invention, together with further objects thereof, will be better understood from a consideration of the following description in conjunction with the drawing figures, in which like reference numerals are carried forward, and in which:

FIGS. 1-5 illustrate consecutive steps in manufacturing an encapsulated electronic device in accordance with all embodiment of the present invention.

DETAILED DESCRIPTION OF THE INVENTION

Figure 1:

Referring now to the drawings, FIG. 1 shows a substrate 10 supporting a pattern of two electrical conductors indicated at 12, 13, respectively. Substrate 10 comprises a suitable electrically insulating material such as a glass-epoxy resin, typically used to construct printed-circuit boards, or a ceramic such as alumina, typically used to construct hybrid circuits. Electrical conductors 12, 13 each comprise an electrically conductive metal such as copper or palladium silver. Electrical conductors 12, 13 are formed on substrate 10 using any suitable process, for example by thick-film deposition when substrate 10 comprises a ceramic, or by etching when the substrate comprises a printed circuit board.

Figure 2:
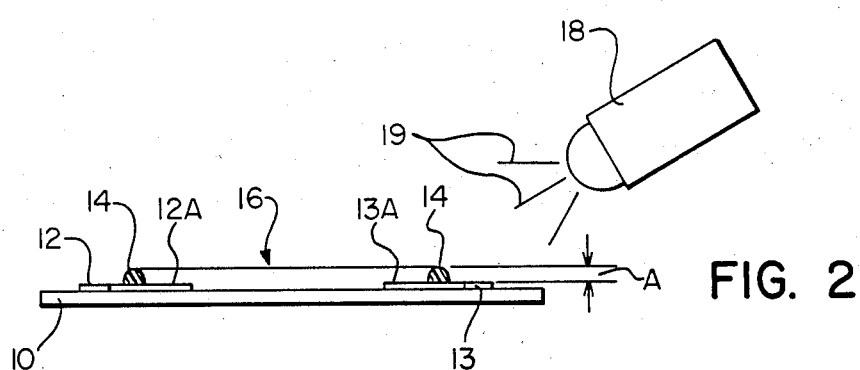

Referring now to FIG. 2, a circular barrier 14 of radiatively curable material is disposed about a predetermined region 16 of substrate 10. (The circular shape of barrier 14 is best shown in FIG. 5). As shown, electrical conductors 12 and 13 each include portions, indicated at 12A and 13A, which extend inside of barrier 14 within region 16. Barrier 14 preferably comprises an ultraviolet (UV) curable material such as the dielectric polymer CERMALLOY UV 5270T available from the Hercules Corp., and is preferably deposited on substrate 10 (and over conductor portions 12A, 13A) using a thick-film deposition process such as screen-printing. Such a thick-film deposition process provides barrier 14 with a height A of approximately 4–5 mils. The exact height of barrier 14 is not, however, critical. So long as it is sufficient to contain the flow of an encapsulant (described below), the barrier may be formed using any suitable method for depositing a radiatively curable material on a substrate. After barrier 14 is deposited on substrate 10, the barrier is exposed to a source 18 of suitable curing radiation 19. When barrier 14 comprises a UV curable material, source 18 is selected to be a source of UV radiation 19.

Figure 3:
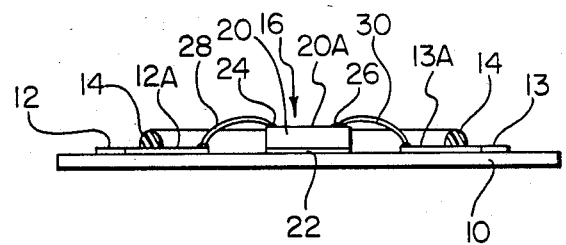

Referring now to FIG. 3, an electronic device 20 is placed on region 16 of substrate 10 using, for example, a suitable adhesive 22. Electronic device 20 includes a pair of electrical terminals 24, 26, connected to electrical conductor portions 12A, 13A by electrically conductive wires 28, 30, respectively. It will be understood that wires 28, 30 comprise any suitable electrical conductors connected with any suitable bond. For example, conductors 28, 30 can comprise ultrasonically bonded wires, or soldered Tape Automated Bonding (TAB) leads.

Figure 4:
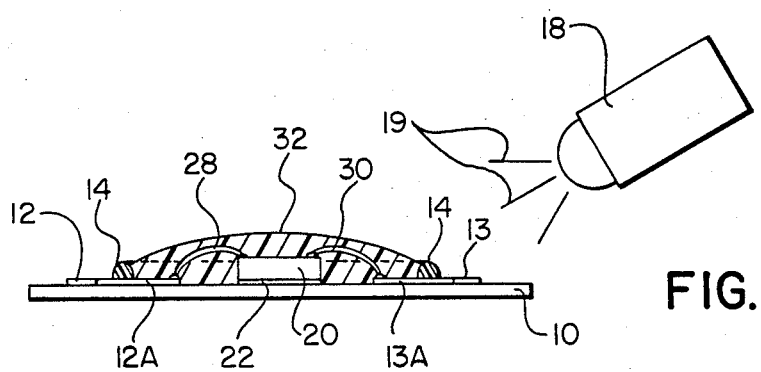

Referring now to FIG. 4, an encapsulant 32 is deposited within barrier 14 over electronic device 210, wires 28, 30, and electrical conductor portions 12A, 13A. Encapsulant 32 is deposited into region 16 while in a viscous state, for example using a syringe (not shown). It will be appreciated that, encapsulant 32 being deposited on substrate 10 while in a viscous state, in this embodiment of the invention the flow of the encapsulant is naturally contained within barrier 14. Encapsulant 32 can comprise any curable material which exhibits qualities suitable for encapsulating electronic components, such as: being electrically insulating; moisture resistant; adhesive to substrate 10; and exhibiting a coefficient of thermal expansion substantially matching that of substrate 10. In a preferred embodiment of the invention, encapsulant 32 comprises a UV curable material. After deposition of encapsulant 32 on substrate 10, the encapsulant is exposed to curing radiation 19 for a time sufficient to cause adequate cross-linking and hence hardening. A top view of the finished hybrid circuit 40 is shown in FIG. 5.

There is thus provided a method of encapsulating an electronic device wherein barrier 14 can be quickly and economically cured using radiation. This speed of curing permits the shape and extent of the periphery of encapsulant 32, which is essentially the same as the periphery of barrier 14, to be closely controlled. The method can thus be applied to densely packed electronic components such as are found in modern hybrid circuits.

In a preferred embodiment of the invention described above, encapsulant 32 comprises an optically clear, UV curable material such as the optical polymer NOR- LAND 63 available from NORLAND Products, Inc. Electronic device 20 comprises a photoelectric device, such as a photodiode, including a light-sensing surface 20A (shown in FIG. 3) facing away from substrate 10 and into the encapsulant. This preferred embodiment of the invention provides encapsulant 32 with a functional, concave lens-like cross-sectional shape. This lens-like shape, visible in FIG. 4, is believed to provide focusing of light onto surface 20A of photodiode 20 and enhance the operation of the photodiode. Further, when using the preferred screen-printing process for depositing barrier 14, the lens-like shape of encapsulant 32 is markedly and unexpectedly uniform amongst the completed devices. Thus, the screen-printing process provides the ability to form many such encapsulated devices of uniform characteristic in relatively few and economical steps.

There are thus provided multiple methods for encapsulating electronic devices, and the subsequently formed encapsulated electronic devices, which provide substantial improvements and advantages over the prior art.

While preferred embodiments of the invention have been illustrated and described, it will be clear that the invention is not so limited. Numerous modifications, changes, variations, substitutions, and equivalents will occur to those skilled in the art without departing from the spirit and scope of the present invention.

What is claimed is:

1. A method of encapsulating an electronic device, in the form of a photoelectric device having a light-sensing surface, on a substrate comprising the steps of:
    forming a barrier in place on the substrate by depositing a radiatively curable material about a predetermined location on said substrate, and curing said deposited material using suitable radiation;
    placing said electronic device within said formed barrier with the light-sensing surface facing away from the substrate; and
    depositing an optically clear encapsulant in a viscous state over said electronic device within said barrier, and curing said deposited encapsulant to form an encapsulation to enhance the focusing onto said light-sensing surface of light received from an external source.

2. The method of claim 1 wherein:
    said encapsulant comprises a radiatively curable material; and the step of curing said encapsulant comprises curing said encapsulant using suitable radiation.

3. The method of claim 2 wherein said barrier and said encapsulant each comprise an ultraviolet radiation curable material.

4. The method of claim 1 wherein said step of depositing said barrier is performed by screen printing said barrier onto said substrate.

5. The method of claim 1 wherein said substrate supports a pattern of electrical conductors; and further including the step of
    connecting said electronic device to said pattern of electrical conductors.

6. The method of claim 5 wherein:
    said pattern of electrical conductors includes portions situated within said barrier;
    said connecting step is performed by connecting said electrical device to said pattern of electrical conductors using wires; and
    said wires are contained within said encapsulant.

7. The method of claim 1 wherein said photoelectrical device comprises a photodiode including a light sensing portion facing away from said substrate into said encapsulant.

8. A method of encapsulating a photoelectric device having a light-sensing surface on a substrate including a pattern of electrical conductors comprising the steps of:

forming a barrier in place on the substrate by screen printing a radiatively curable material about a predetermined location on said substrate, and curing said material using suitable radiation;

placing said phtotelectric device within said formed barrier with the light-sensing surface facing away from said substrate;

connecting said photoelectric device to said pattern of electrical conductors using wires;

depositing an encapsulant comprising a radiatively curable, optically transparent material in a viscous state over said photoelectric device and said wires within said barrier, and curing said deposited encapsulant using suitable radiation to form a concave lens-like cross-sectional shaped encapsulation to enhance focusing into said light-sensing surface of light received from an external source.

9. The method of claim 8 wherein said barrier and said encapsulant each comprise an ultraviolet radiation curable material.

10. The method of claim 9 wherein said electronic component comprises a photodiode including a light sensing portion facing away from said substrate into said encapsulant.

11. A method of encapsulating a photoelectric device having a light-sensing surface on a substrate, comprising the steps of:

forming a barrier in place on the substrate by depositing a curable material about a predetermined location on said substrate, and curing said deposited material;

placing the device within the formed barrier with the light-sensing surface facing away from the substrate;

depositing an optically clear encapsulant in a viscous state over said device within said barrier, and curing said deposited encapsulant to form a concave lens-like cross-sectional shaped encapsulation to enhance the focusing onto said light-sensing surface of light received from an external source.

12. A method as in claim 11, wherein said barrier forming step comprises forming a circular barrier.

13. A method as in claim 11, wherein said barrier forming step comprises depositing said curable material by means of a thick film deposition process.

14. A method as in claim 13, wherein said thick film deposition process comprises screen printing.

15. A method as in claim 11, wherein said encapsulant depositing and curing step comprises depositing an ultraviolet radiation curable encapsulant and curing said deposited encapsulant with ultraviolet radiation.

16. A method as in claim 15, wherin said barrier forming step comprises depositing an ultraviolet radiation curable material and curing said deposited material with ultraviolet radiation.

* * * * *